United States Patent
Ferrant et al.

(10) Patent No.: US 6,583,459 B1
(45) Date of Patent: Jun. 24, 2003

(54) RANDOM ACCESS MEMORY CELL AND METHOD FOR FABRICATING SAME

(75) Inventors: Richard J. Ferrant, Saint Ismier (FR); Tsiu C. Chan, Carrollton, TX (US)

(73) Assignee: STMicroelectronics, Inc., Carrollton, TX (US)

( * ) Notice: Subject to any disclaimer, the term of this patent is extended or adjusted under 35 U.S.C. 154(b) by 0 days.

(21) Appl. No.: 09/607,780

(22) Filed: Jun. 30, 2000

(51) Int. Cl.⁷ .............................................. H01L 27/108
(52) U.S. Cl. ....................................... 257/296; 257/297
(58) Field of Search .................................. 257/296, 297

(56) References Cited

U.S. PATENT DOCUMENTS

| | | | |
|---|---|---|---|
| 5,475,633 A | | 12/1995 | Mehalel ........................ 365/154 |
| 5,965,922 A | | 10/1999 | Matsui ........................ 257/369 |
| 5,994,738 A | * | 11/1999 | Wollesen ..................... 257/347 |
| 6,038,163 A | | 3/2000 | Clemens et al. ............ 365/154 |
| 6,097,065 A | * | 8/2000 | Forbes et al. ................ 257/350 |
| 6,172,899 B1 | * | 1/2001 | Marr et al. .................. 365/154 |
| 6,222,780 B1 | | 4/2001 | Takahashi .............. 365/189.09 |
| 6,229,342 B1 | * | 5/2001 | Noble et al. ................. 326/102 |

FOREIGN PATENT DOCUMENTS

| JP | 04252626 | 4/1994 |
|---|---|---|
| JP | 11170476 | 1/2001 |

OTHER PUBLICATIONS

EPO; European Search Report on EP Appl. No. 01305263.4; Oct. 25, 2001.

* cited by examiner

*Primary Examiner*—T. N. Quach
(74) *Attorney, Agent, or Firm*—Lisa K. Jorgenson; Andre Szuwalski

(57) ABSTRACT

A random access memory cell and fabrication method therefor are disclosed. The random access memory cell includes a first and a second pull-down transistor cross-coupled such that a control terminal of the first pull-down transistor is connected to a conduction terminal of the second pull-down transistors, and the control terminal of the second pull-down transistor is connected to the conduction terminal of the first pull-down transistor. A first pass gate transistor is coupled between the conduction terminal of the first transistor and a first bit line of a bit line pair, and a second pass gate transistor is coupled between the conduction terminal of the second transistor and a second bit line of the bit line pair. The threshold voltage of the first and second pass gate transistors is such that a subthreshold current is provided to the first and second pull-down transistors when the memory cell is not being accessed such that the conduction terminal of the pull-down transistor that is turned off is maintained at a voltage level corresponding to a logic high voltage. In this way, the memory cell is capable of performing a latching function without pull-up transistors.

29 Claims, 6 Drawing Sheets

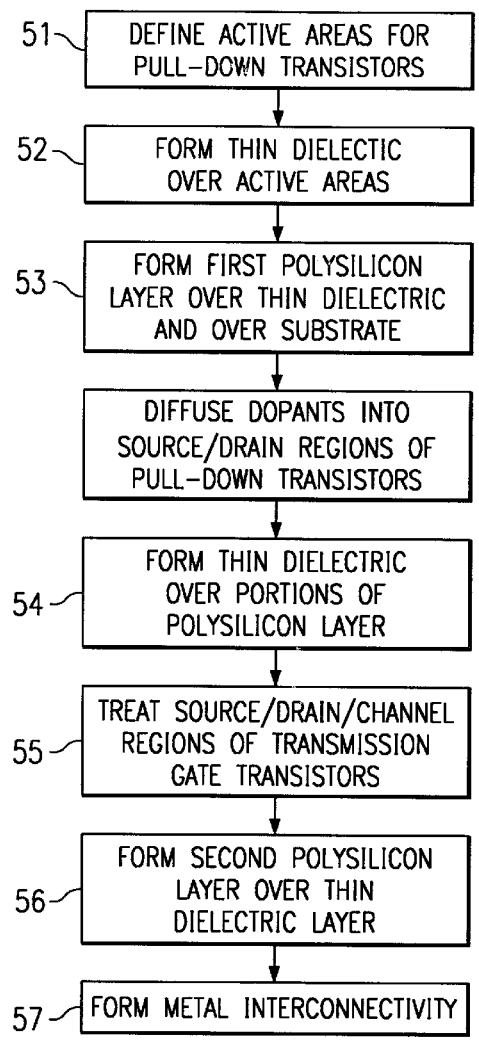
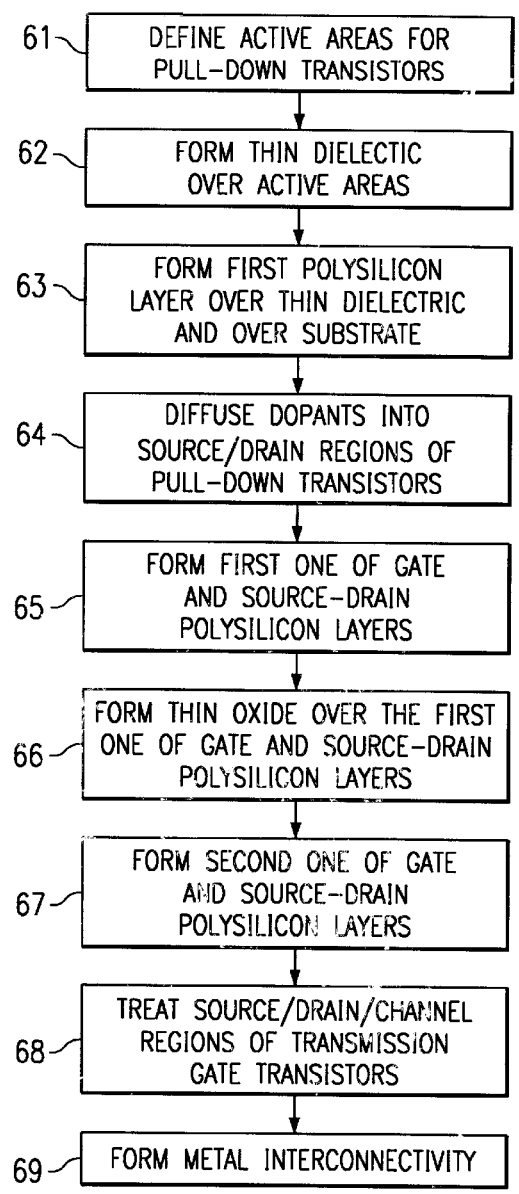
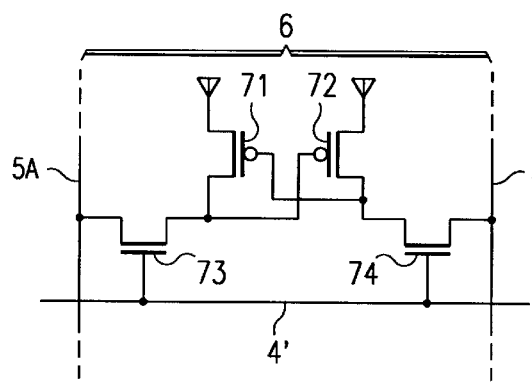

RANDOM ACCESS MEMORY CELL AND METHOD FOR FABRICATING SAME

BACKGROUND OF THE INVENTION

1. Technical Field of the Invention

The present invention relates to a volatile memory cell circuit, and particularly to a memory cell circuit for a static random access memory device.

2. Background of the Invention

Static random access memory (SRAM) devices have been employed for decades to store electronic data. An SRAM device includes an array of memory cells organized into rows and columns of memory cells. An addressable word line is coupled to the memory cells in a distinct row of memory cells. The memory cells in a column of memory cells are coupled to an addressable pair of bit lines. Data is written to and read from a memory cell in the memory cell array by selecting a row of memory cells and accessing memory cells therein that are coupled to selected bit line pairs. The organization and operation of SRAM devices are well known in the art.

The conventional SRAM cell is a six transistor (6T) cell. specifically, the SRAM includes a latch element formed by a pair of cross coupled inverters. The latch element stores a single bit of data, with the value of the data bit depending upon the state of the latch element. The conventional SRAM cell includes a pair of transmission or pass gate transistors coupled to the input of the cross-coupled inverters. The pass gate transistors provide access to the SRAM for reading and writing data. The 6T SRAM cell is well known in the art.

Over the years, attempts have been made to optimize the SRAM cell. Improvements have occurred primarily with respect to memory cell layout and/or fabrication techniques. Little changes, however, have been directed to reducing the circuit itself so as to reduce fabrication complexity.

SUMMARY OF THE INVENTION

The present invention is directed towards reducing the circuitry within the SRAM cell. According to an embodiment of the present invention, the SRAM cell is a four transistor (4T) cell including a first and a second pull-down transistor. A first transmission or pass gate transistor has a first source/drain terminal connected to a first bit line of a bit line pair and a second source/drain terminal connected to the drain terminal of the first pull-down transistor and the gate terminal of the second pull-down transistor. A second transmission or pass gate transistor has a first source/drain terminal connected to a second bit line of the bit line pair and a second source/drain terminal connected to the drain terminal of the second pull-down transistor and the gate terminal of the first pull-down transistor. The gate terminal of the first and second transmission gate transistors is connected to a word line of the SRAM device. The first and second pull-down transistors are bulk transistors having source/drain regions formed in a semiconductor substrate. The first and second transmission gate transistors are thin film transistors. The memory cell is without pull-up transistors that are typically coupled to the pull-down transistors in conventional SRAM cell designs.

In order for the SRAM cell to maintain data, the first and second transmission gate transistors produce a subthreshold current that flows from the bit lines (tied to a high reference voltage level when the memory cell is not being accessed) and through the first and second transmission gate transistors to the first and second pull-down transistor. The amount of subthreshold current is sized by setting the threshold voltage of the first and second transmission gate transistors so that the drain terminal of the pull-down transistor that is turned off is pulled to a voltage level representing a logic high level. In this way, the memory cell performs a latching function in remaining in one of two latched states, thus preserving the data bit value represented thereby.

The fabrication of the SRAM includes initially forming first and second bulk transistors, each of the first and second bulk transistors including drain/source regions defined in a semiconductor substrate and a gate region. Next and/or as part of the steps involved with forming the bulk transistors, the first and second thin film transistors are formed over the semiconductor substrate. Each of the first and second thin film transistors including gate, drain and source regions, so that the drain region of the first thin film transistor is connected to the drain region of the first bulk transistor and the gate region of the second bulk transistor, and the drain region of the second thin film transistor is connected to the drain region of the second bulk transistor and the gate region of the first bulk transistor. Next, the threshold voltage of the first and second thin film transistors are set so that a subthreshold current of the first thin film transistor is capable of maintaining the drain region of the first bulk transistor at a logic high level when the first bulk transistor is turned off, and a subthreshold leakage current of the second thin film transistor is capable of maintaining the drain region of the second bulk transistor at a logic high level when the second bulk transistor is turned off.

BRIEF DESCRIPTION OF THE DRAWINGS

A more complete understanding of the system and method of the present invention may be obtained by reference to the following Detailed Description when taken in conjunction with the accompanying Drawings wherein:

FIGS. 4–6 are flow charts illustrating steps of fabricating an SRAM cell according to other embodiments of the present invention; and FIG. 7 is a schematic diagram of an SRAM cell from the SRAM device of FIG. 1 according to an embodiment of the present invention.

DETAILED DESCRIPTION OF THE PREFERRED EXEMPLARY EMBODIMENTS

Figure 1:
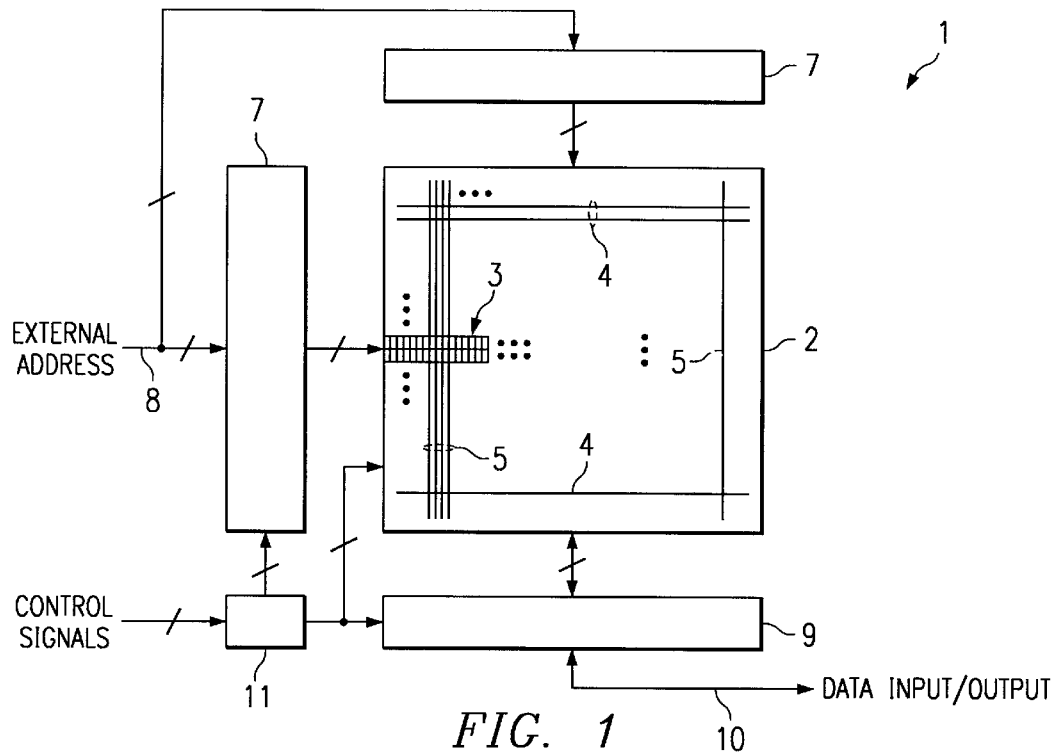
FIG. 1 is a function block diagram of an SRAM device according to an embodiment of the present invention.

The present invention will now be described more fully hereinafter with reference to the accompanying drawings in which a preferred embodiment of the invention is shown. The embodiment is provided so that this disclosure will be thorough and complete.

An embodiment of the present invention is directed towards a nonvolatile memory device, and particularly to a memory cell therefor. The embodiment of the present invention is illustrated in the drawings and described below as a static random access memory (SRAM) device, but it is understood that embodiments of the present invention may be implemented as other nonvolatile memory devices, such as a dynamic random access memory device.

Referring to FIG. 1, there is disclosed a static random access memory (SRAM) device 1 according to an exemplary embodiment of the present invention. The SRAM device 1 is a nonvolatile memory device that stores bits of data without the need for refresh operations in order to maintain data integrity.

The SRAM device 1 may include at least one memory cell array 2 that is organized into rows and columns of memory cells 3. Each row of memory cells is coupled to a distinct word line 4, and each column of memory cells is coupled to a distinct pair 6 of bit lines 5.

The SRAM device 1 may further include an address decode block 7 that receives as an input an external address 8, the value of which identifies one or more specific memory cells 3 Based upon the value of external address 8, address decode block 7 drives the corresponding word line 4 to a voltage level so as to connect the memory cells 3 in the selected row to bit lines 5. SRAM device 1 may further include an input/output (I/O) block 9 that serves as an interface for data 10 read from or to be written to memory cell array 2. Address decode block 7 may also connect columns of memory cells and/or pairs 6 of bit lines 5 to I/O block 9 based upon the value of external address 8. SRAM device 1 may include a control block 11 for performing a number of functions, such as charging bit lines 5 to a high reference voltage level prior to and/or between the execution of memory access operations.

Figure 2:
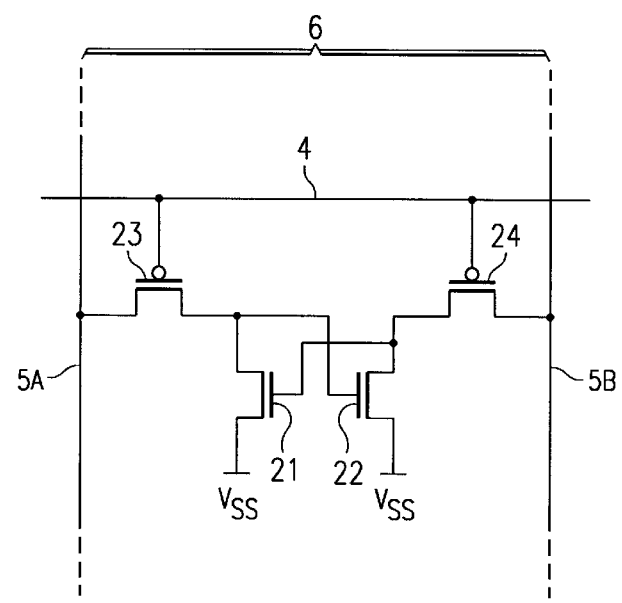
FIG. 2 is a schematic diagram of an SRAM cell from the SRAM device of FIG. 1 according to an embodiment of the present invention.

As stated above, memory cell array 2 includes a plurality of SRAM cells 3 organized into rows and columns. FIG. 2 illustrates one SRAM cell 3 according to a first exemplary embodiment of the present invention, together with a word line 4 and a pair 6 of bit lines 5A and 5B coupled to SRAM cell 3. SRAM cell 3 is illustrated in FIG. 2 as including MOS transistors for exemplary purposes only. It is understood that SRAM cell 3 may be implemented with other components, such as with transistors other than MOS transistors.

In accordance with an embodiment of the present invention, SRAM cell 3 includes a first pull-down transistor 21 and a second pull-down transistor 22. Pull-down transistors 21 and 22 may be n-channel MOS transistors. A first conduction and/or source terminal of first and second pull-down transistors 21 and 22 is coupled to a low reference voltage source Vss. A second conduction and/or drain terminal of first pull-down transistor 21 is coupled to the control and/or gate terminal of second pull-down transistor 22. A second conduction and/or drain terminal of second pull-down transistor 22 is coupled to the control and/or gate terminal of first pull-down transistor 21.

The SRAM cell 3 further includes transmission and/or pass gate transistors 23 and 24. Transmission gate transistors 23 and 24 may be p-channel MOS transistors, but it is understood that transmission gate transistors 23 and 24 may be other transistors, such as n-channel MOS transistors. A first transmission gate transistor 23 has a first conduction or drain/source terminal coupled to a first bit line 5A of bit line pair 6. A second conduction or drain/source terminal of first transmission gate transistor 23 is coupled to the drain terminal of first pull-down transistor 21 and the gate terminal of second pull-down transistor 22. Similarly, a second transmission gate transistor 24 has a first conduction or drain/source terminal coupled to a second bit line 5B of bit line pair 6. A second conduction or drain/source terminal of second transmission gate transistor 24 is coupled to the drain terminal of second pull-down transistor 22 and the gate terminal of first pull-down transistor 21. The gate terminals of transmission gate transistors 23 and 24 are coupled to a word line 4.

According to the embodiment of the present invention, SRAM cell 3 does not include pull-up transistors that are found in conventional SRAM cells. Consequently, the steps necessary for fabricating SRAM device 1 are reduced, thereby reducing fabrication costs.

Despite the absence of pull-up transistors, each SRAM cell 3 nonetheless performs a latching function to effectuate storing a bit of data. Specifically, SRAM device 1, like conventional or existing SRAM devices, charges or otherwise normally maintains both bit lines 5A and 5B at the high reference voltage level vdd when SRAM cell 3 is not being accessed. Because first and second transmission gate transistors 23 and 24 are turned off when SRAM cell 3 is not being accessed, the operating and/or electrical characteristics of transmission gate transistors 23 and 24 are such that a subthreshold current flows from bit lines 5A and 5B through transmission gate transistors 23 and 24, respectively, when transmission gate transistors 23 and 24 are turned off. This subthreshold current, that flows from bit lines 5 (normally tied to high reference voltage Vdd) and through the transmission gate transistors 23 and 24, is sized so that the drain terminal of the turned off pull-down transistor is pulled to a voltage level representative of a logic high voltage level. Maintaining the voltage level of the drain terminal of the turned-off pull-down transistor within the logic high voltage level range ensures that the other pull-down transistor, the pull-down transistor that is turned on, remains turned on. With the turned-on pull-down transistor remaining in a turned-on state, the drain terminal of the turned-on transistor remains pulled towards the low reference voltage level Vss, thereupon maintaining the turned-off pull-down transistor in the turned-off state. In this way, SRAM cell 3 maintains its latched state following a memory access operation and thus preserves the data value corresponding to the latched state.

Because a non-trivial subthreshold current level is needed to maintain SRAM cell 3 in the desired latched state and noting that thin film transistors typically have higher subthreshold current levels than the subthreshold current levels in bulk (substrate) transistors, transmission gate transistors 23 and 24 are thin film transistors. Alternatively, transmission gate transistors 23 and 24 may be other types of transistors, such as bulk transistors configured to allow the requisite subthreshold current level.

During normal operation of SRAM device 1, bit lines 5 are charged or otherwise maintained at the high reference voltage level Vdd. During a memory access operation, either a memory read or write operation, word line 4 is driven towards a low reference voltage level Vss, which turns on transmission gate transistors 23 and 24 and thereby couples the drain terminals of pull-down transistors 21 and 22 to bit lines 5A and 5B, respectively. For a memory write operation, data to be written to SRAM cell 3 appears on bit lines 5A and 5B and turns on a first one of pull-down transistors 21 and 22 and turns off a second one thereof. For a memory read operation, the latched state of SRAM cell 3 drives a first one of bit lines 5A and 5B (the bit line 5 coupled to the drain terminal of the turned on pull-down transistor) towards the low reference voltage level Vss and a second one of bit lines 5A and 5B (the bit line 5 coupled to the drain terminal of the turned off pull-down transistor) is substantially unaffected and thus remains at the high reference voltage level Vdd.

Following the memory access operation, word line 4 is driven to the high reference voltage level Vdd, which turns off transmission gate transistors 23 and 24 and thereby decouples the drain terminals of pull-down transistors 21 and 22 from bit lines 5A and 5B, respectively. At this time, the voltage appearing on bit lines 5A and 5B is returned to the high reference voltage level Vdd. SRAM cell 3 is now in a latched state wherein one of first pull-down transistor 21 and second pull-down transistor 22 is turned on and the other one is turned off. Assuming the latched state of SRAM cell 3 is such that first pull-down transistor 21 is turned on and second pull-down transistor 22 is turned off, the voltage of the drain terminal of first pull-down transistor 21 and the gate terminal of second pull-down transistor 22 is at approximately the low reference voltage level Vss. In addition, the voltage of the drain terminal of second pull-down transistor 22 and the gate of first terminal of the first pull-down transistor is approximately at the high reference voltage level Vdd.

With transmission gate transistors 23 and 24 turned off, a subthreshold current is provided thereby to the drain terminals of pull-down transistors 21 and 22. The subthreshold current provided by first transmission gate transistor 23 has little effect in changing the low reference voltage Vss appearing on the drain terminal of first pull-down transistor 21. The subthreshold current provided by second transmission gate transistor 24 serves to keep at approximately the high reference voltage level Vdd the drain terminal of second pull-down transistor 22 and the gate terminal of first pull-down transistor 21. This keeps first pull-down transistor 21 turned on and second pull-down transistor turned off. As a result, the subthreshold current provided by transmission gate transistors 23 and 24 serves to maintain SRAM cell 3 in its latched state.

A method of fabricating SRAM cell 3 will be described with reference to FIGS. 3A–3H. The exemplary fabrication method utilizes a four layer polycrystalline silicon, three layer metal process. The resulting SRAM cell 3 includes transmission gate transistors 23 and 24 having drain, source and drain regions formed in a third polycrystalline silicon (polysilicon) layer. The gate region of transmission gate transistors 23 and 24 are formed in a fourth polysilicon layer. The pull-down transistors 21 and 22 are bulk transistors having source and drain regions formed in the monocrystalline silicon substrate.

Figure 3A:
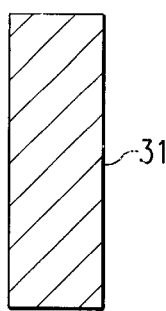
FIGS. 3A–3H are top plan views of an SRAM cell during fabrication, in accordance to an embodiment of the present invention.
Figure 3A:
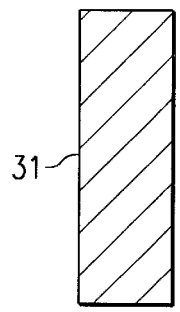
Figure 3B:
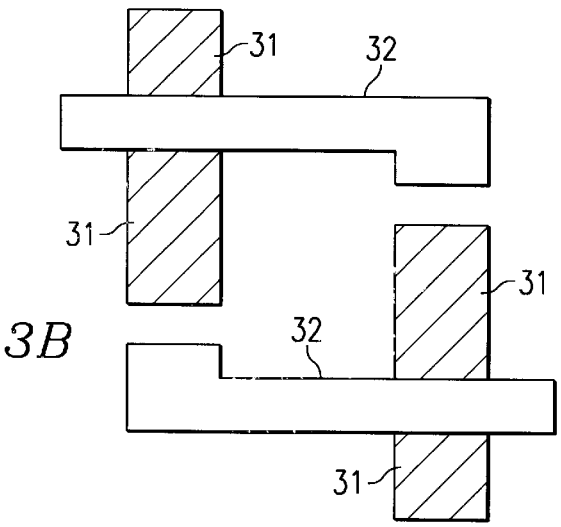
Figure 3C:
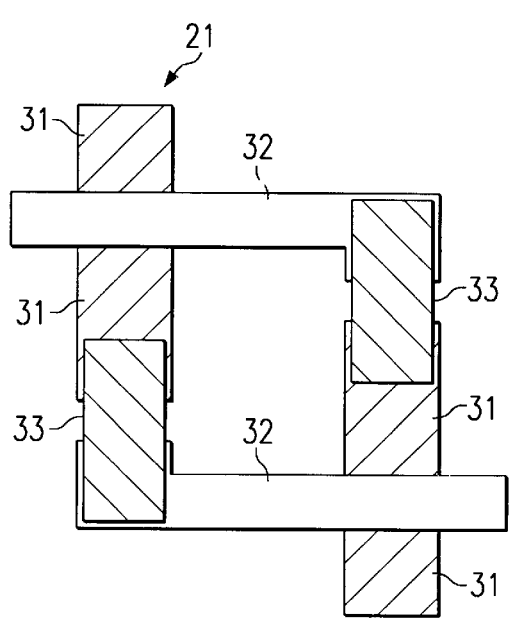
Figure 3D:
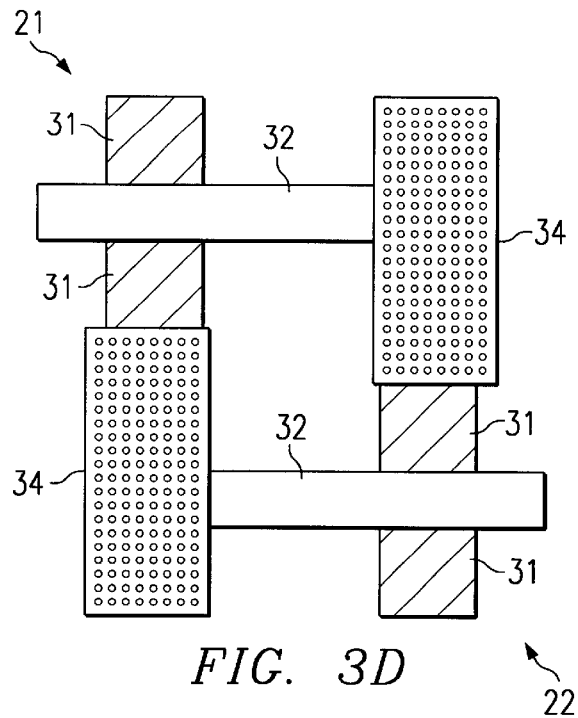
Figure 3E:
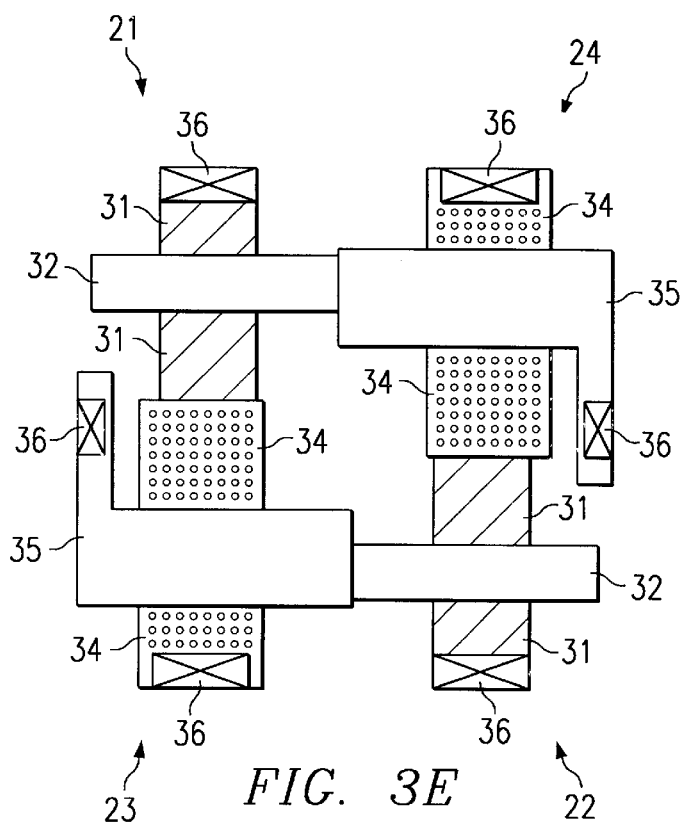
Figure 3F:
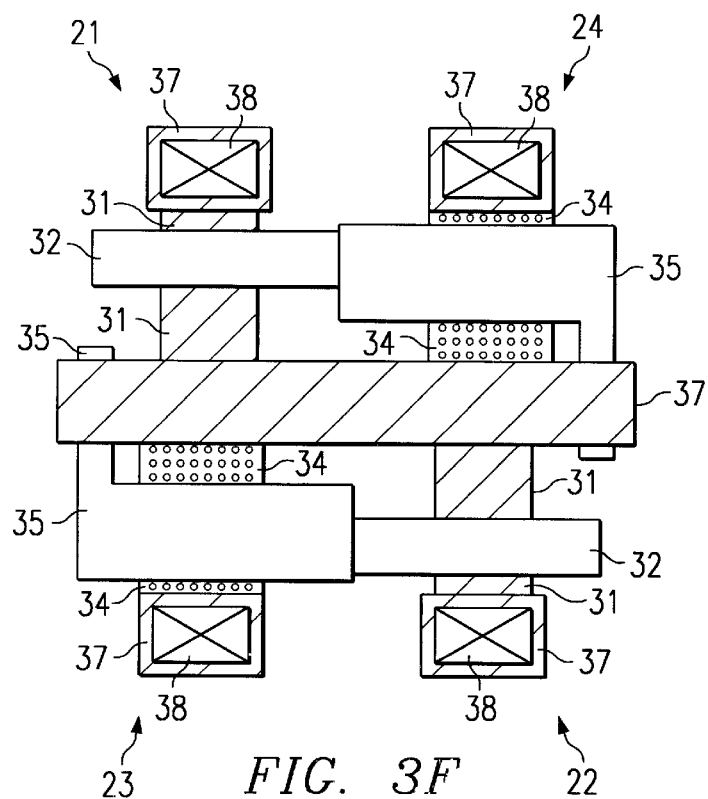
Figure 3G:
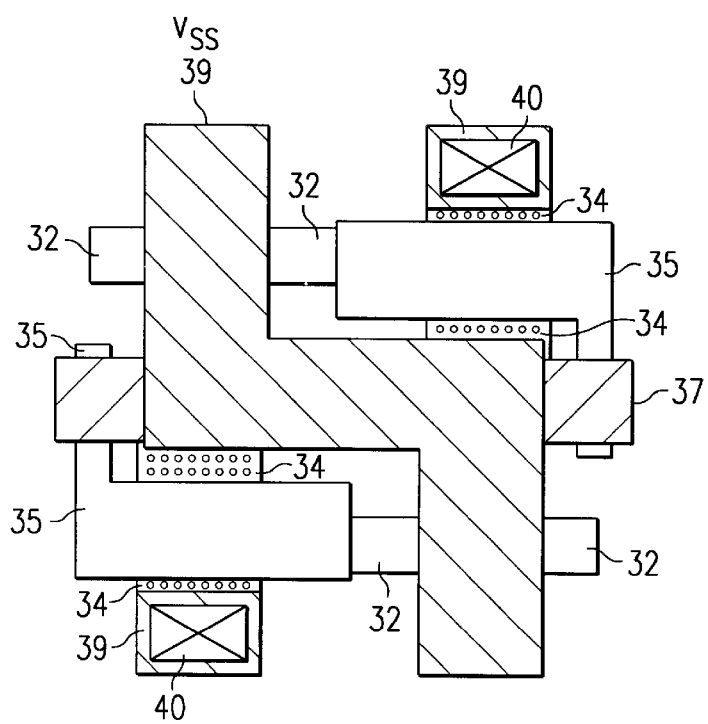

Initially, the active area 31 of first pull-down transistor 21 and second pull-down transistor 22 is defined in the silicon substrate, as shown in FIG. 3A. A thin dielectric layer (not explicitly shown) is formed over active areas 31 and forms the gate dielectric of first and second pull-down transistors 21 and 22. A thick field dielectric is formed elsewhere. Next, a first polysilicon layer 32 (FIG. 3B) is formed over the thin dielectric layer and defines the gate region of first and second pull-down transistors 21 and 22. A first interpoly dielectric layer is then formed over first polysilicon layer 32. At this point, n-type dopants may be diffused in the drain and source regions of the first and second pull-down transistors 21 and 22.

For the multiple polysilicon layer process, interpoly dielectric layers are disposed between successive polysilicon layers. The interpoly dielectric layers are not illustrated in the drawings for reasons of clarity.

A second polysilicon layer 33 (FIG. 3C) is formed over the semiconductor substrate to provide a contact to connect the drain terminal of first pull-down transistor 21 and the gate terminal of second pull-down transistor 22, and connect the drain terminal of second pull-down transistor 22 and the gate terminal of first pull-down transistor 21. A second interpoly dielectric is then formed over the second polysilicon layer 33. A third polysilicon layer 34 (FIG. 3D) is then formed over the semiconductor substrate so as to define the drain, source and channel regions of first and second transmission gate transistors 23 and 24. A third interpoly dielectric layer is then formed over the third polysilicon layer 34 and forms the gate dielectric of first and second transmission gate transistors 23 and 24.

Next, a fourth polysilicon layer 35 (FIG. 3E) is formed over the third interpoly dielectric layer so as to define the gate region of first and second transmission gate transistors 23 and 24. Contacts 36 are then formed over third polysilicon layer 34 and fourth polysilicon layer 35 so as to define openings for connections from SRAM cell 3 to bit lines 5, word line 4 and the source that provides the low reference voltage level Vss to SRAM device 1.

Following the formation of the transmission gate transistors 23 and 24, transmission gate transistors 23 and 24 are treated to provide the appropriate threshold voltage so that the desired subthreshold current level is provided to pull-down transistors 21 and 22 when transmission gate transistors 23 and 24 are turned off. The threshold voltage setting is based in part upon factors such as the high reference voltage level Vdd and the low reference voltage level Vss. For example, the channel region of transmission gate transistors 23 and 24 may be implanted with ions to achieve the appropriate threshold voltage.

Next, metallization is performed for completing the interconnectivity for SRAM cell 3 within memory cell array 2. It is understood that intermetal dielectric layers are disposed between successive metal layers. Intermetal dielectric layers will not be illustrated in the drawings for reasons of clarity.

A first metal layer 37 (FIG. 3F) pattern is defined over SRAM cell 3 for routing word line 4. First vias 38 are then defined over SRAM cell 3 to provide connectivity between the drain terminal of transmission gate transistor 23 and 24 and bit lines 5A and 5B, respectively, and between the source providing low reference voltage level Vss to SRAM device 1 and the source terminal of transmission gate transistors 21 and 22.

Figure 3H:
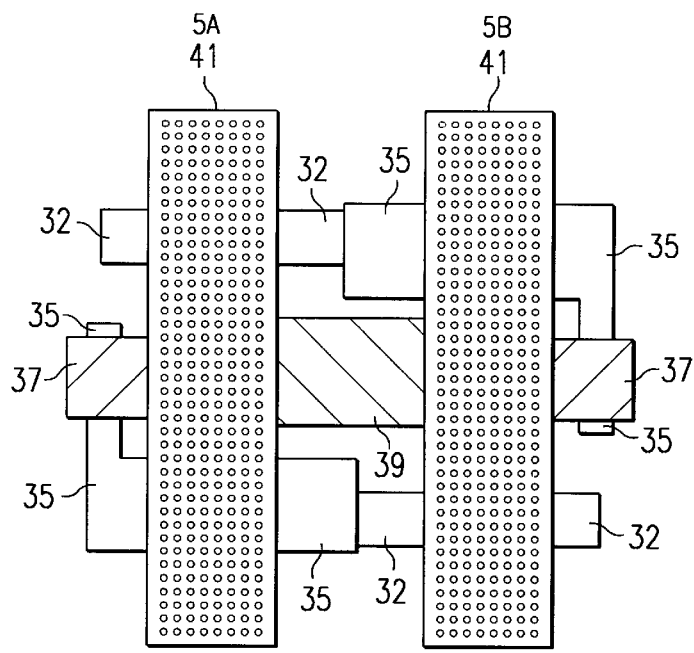

A second metal layer 39 (FIG. 3G) is then patterned over SRAM cell 3 so as to define, among other things, power bussing for low reference voltage Vss. Second vias 40 are then defined in SRAM cell 3. A third layer metal 41 is patterned over SRAM cell 3 for routing bit lines 5A and 5B through SRAM cell 3 and making connections to transmission gate transistors 23 and 24 (FIG. 3H).

It is understood that there are many other ways in which SRAM cell 3 may be fabricated. With transmission gate transistors 23 and 24 implemented as thin film transistors, transmission gate transistors 23 and 24 may be formed in at least one layer of polycrystalline semiconductor material. For instance, the gate region of transmission gate transistors 23 and 24 may be formed in the diffusion region within a monocrystalline semiconductor substrate, and the drain, source and channel regions of transmission gate transistors 23 and 24 may be formed in a first layer of polycrystalline material disposed over the semiconductor substrate.

Figure 4:
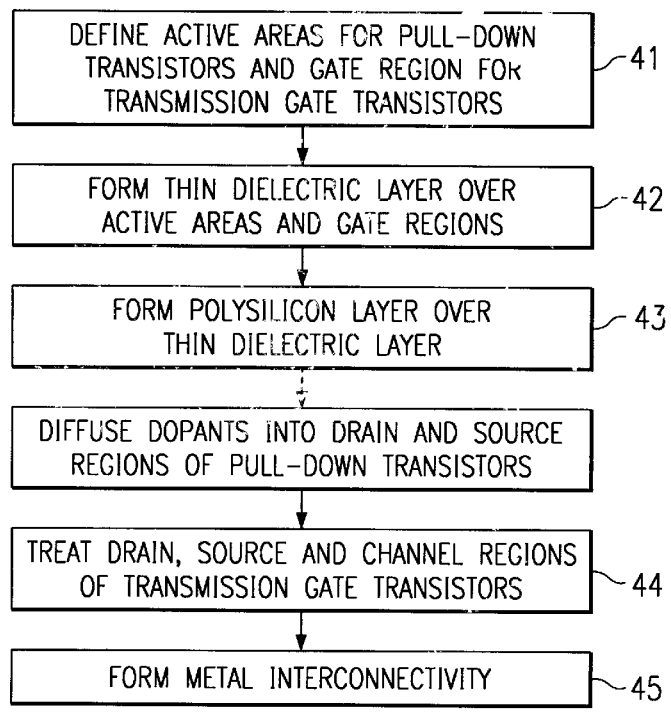

With respect to the method of fabricating the SRAM cell 3 in which the gate region of transmission gate transistors 23 and 24 is formed in the semiconductor substrate and the drain, source and channel regions are formed in the first polycrystalline material layer, reference is made to FIG. 4. The method includes the step of defining the active areas for pull-down transistors 21 and 22, and the gate region of transmission gate transistors 23 and 24 (step 41). Next, a first thin dielectric layer is formed over the active areas and the gate region so as to define the gate dielectric of pull-down transistors 21 and 22 and transmission gate transistors 23 and 24 (step 42). Next, the first polysilicon layer is formed over the thin dielectric layer so as to define the gate region of pull-down transistors 21 and 22 and the drain, source and channel regions of transmission gate transistors 23 and 24 (step 43). Next, the drain, source and channel regions of transmission gate transistors 23 and 24 are treated to provide the desired conductivity and threshold voltage for transmission gate transistors 23 and 24 (step 44). Thereafter, one or more layers of metal may be formed over the substrate to provide interconnectivity to bit lines 5, word line 4 and the power bussing for low reference voltage level Vss (step 45).

Alternatively, the drain, source and channel regions of transmission gate transistors 23 and 24 may be formed in the first layer of polycrystalline material disposed over a thick dielectric layer covering a portion of the semiconductor substrate, and the gate region of transmission gate transistors 23 and 24 may be formed in a second polycrystalline semiconductor layer that is separated from the first polycrystalline semiconductor layer by a second thin dielectric layer.

With respect to a method of fabricating the SRAM cell 3 in which drain, source and channel regions of transmission gate transistors 23 and 24 are formed in the first polysilicon layer and gate region is formed in the second polysilicon layer, reference is made to FIG. 5. The method includes the step of defining the active areas for pull-down transistors 21 and 22, (step 51). Next, a thin dielectric layer is formed over the active areas so as to define the gate dielectric of pull-down transistors 21 and 22 (step 52). Next, the first polysilicon layer is formed over the thin dielectric layer so as to define the gate region of pull-down transistors 21 and 22 and the drain, source and channel regions of transmission gate transistors 23 and 24 (step 53). A thin dielectric is formed over the channel region of transmission gate transistors 23 and 24 to define the gate dielectric thereof (step 54). Next, the drain, source and channel regions of transmission gate transistors 23 and 24 are treated to provide the desired conductivity and threshold voltage (step 55). A second polysilicon layer is formed over the gate dielectric layer of transmission gate transistors 23 and 24 (step 56). Thereafter, one or more layers of metal may be formed over the substrate to provide interconnectivity to bit lines 5, word line 4 and the power bussing for low reference voltage level Vss (step 56).

For a fabrication process utilizing at least three layers of polycrystalline material and/or polysilicon, the gate region of transmission gate transistors 23 and 24 may be formed in a first one of the second and third polysilicon layers, and the drain, source and channel regions thereof may be formed in a second one of the second and third polysilicon layers. In general terms, the gate region of transmission gate transistors 23 and 24 may be formed in a gate polysilicon layer and the drain, source and channel regions formed in a source/drain polysilicon layer, wherein the gate polysilicon may be disposed between the semiconductor substrate and the source/drain polysilicon layer or the source/drain polysilicon layer may be disposed between the semiconductor substrate and the gate polysilicon layer.

With respect to the method of fabricating the SRAM cell 3 in which drain, source and channel regions of the transmission gate transistors 23 and 24 are formed in the source/drain polysilicon layer and gate regions are formed in the gate polysilicon layer, reference is made to FIG. 6. The method includes the steps of forming pull-down transistors 21 and 22 (defining the active areas for pull-down transistors 21 and 22 at step 61; forming at step 62 a thin dielectric layer over the active areas so as to define the gate dielectric of pull-down transistors 21 and 22; forming the first polysilicon layer over the thin dielectric layer so as to define the gate region of pull-down transistors 21 and 22 at step 63; and diffusing dopants at step 64 into the drain and source regions of pull-down transistors 21 and 22).

The method further includes the step of forming a first one of the source/drain polysilicon layer and the gate polysilicon layer over the substrate at step 65. This steps defines either the drain, source and channel regions of transmission gate transistors 23 and 24 or the gate region thereof. Next, a thin dielectric layer is disposed over the recently formed polysilicon layer at step 66 so as to define the gate dielectric of transmission gate transistors 23 and 24. A second one of the source/drain polysilicon layer and the gate polysilicon layer is formed over the substrate at step 67. This forms either the gate region of transmission gate transistors 23 and 24 or the drain, source and channel regions thereof. Next, the drain, source and channel regions of transmission gate transistors 23 and 24 are treated at step 68 so that transmission gate transistors 23 and 24 have the desired threshold voltage to provide the appropriate subthreshold current when turned off. Thereafter, one or more layers of metal may be formed over the substrate to provide interconnectivity to bit lines 5, word line 4 and the power bussing for low reference voltage level Vss (step 69).

The design of SRAM cell 3 offers a number of advantages. Because SRAM cell 3 does not include pull-up transistors found in conventional SRAM cells (see FIG. 2), less polycrystalline semiconductor layers and/or semiconductor substrate area are needed to form SRAM cell 3. In addition, because SRAM cell 3 does not include connections to the high reference voltage Vdd, less metal layers are needed for power bus routing over SRAM cell 3. The reduced number of layers results in a significant savings in fabrication costs.

As stated above, SRAM cell 3 of FIG. 2 is without pull-up transistors that are typically found in conventional SRAM devices. In accordance with a second exemplary embodiment of the present invention, SRAM cell 3 may include pull-up transistors and exclude pull-down transistors. Referring to FIG. 7, there is shown such an SRAM cell 3', including a first pull-up transistor 71 and a second pull-up transistor 72. The drain terminal of pull-up transistor 71 is connected to the gate terminal of pull-up transistor 72, and the drain terminal of pull-up transistor 72 is connected to the gate terminal of pull-up transistor 71. The source terminals of pull-up transistors 71 and 72 are coupled to high reverence voltage source Vdd. SRAM cell 3' further includes a first transmission gate transistor 73 connected between bit line 5A and the drain terminal of pull-up transistor 71, and a second transmission gate transistor 74 connected between bit line 5B and the drain terminal of pull-up transistor 72. Pull-up transistors 71 and 72 may be p-channel MOS transistors and transmission gate transistors 73 and 74 may be n-channel MOS transistors, but it is understood that such transistors may be other transistor types as well. Word line 4', to which the gate terminals of transmission gate transistors 73 and 74 are connected, is driven to the high reference voltage level in order to couple SRAM cell 3' to bit lines 5A and 5B.

Transmission gate transistor 73 has an operating and/or threshold voltage characteristic such that a subthreshold current thereof maintains the drain terminal of pull-up transistor 71 at a voltage level representing a logic low level, when pull-up transistor 71 is turned off. Likewise, transmission gate transistor 74 has an operating and/or threshold voltage characteristic such that a subthreshold current thereof maintains the drain terminal of pull-up transistor 72 at a voltage level representing a logic low level, when pull-up transistor 72 is turned off. In this way and assuming that bit lines 5A and 5B are at the low reference voltage level between memory access operations, SRAM cell 3' is capable of performing a latching function without the need for pull-down transistors.

Due to the subthreshold current requirements for transmission gate transistors 73 and 74, transmission gate transistors 73 and 74 may be thin film transistors. Pull-up transistors 71 and 72 may be implemented as bulk (substrate) transistors. Consequently, the methods described above and illustrated in FIGS. 3A–3H and 4–6 may be utilized in fabricating SRAM cell 3', with the exception that the second metal layer 39 (FIG. 3G) is utilized to provide power bus routing for the high reference voltage source Vdd instead of the low reference voltage source Vss.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A random access memory cell, comprising:
    a first transistor having a control terminal, a first conduction terminal connected to a reference voltage supply and a second conduction terminal;
    a second transistor having a control terminal connected to the second conduction terminal of the first transistor, a first conduction terminal connected to the reference voltage supply and a second conduction terminal connected to the control terminal of the first transistor;
    a first transmission gate transistor having a control terminal capable of being connected to a word line, a first conduction terminal capable of being connected to a first bit line of a bit line pair, and a second conduction terminal connected to the second conduction terminal of the first transistor; and
    a second transmission gate transistor having a control terminal capable of being connected to the word line, a first conduction terminal capable of being connected to a second bit line of the bit line pair, and a second conduction terminal connected to the second conduction terminal of the second transistor;
    the first transmission gate transistor having a threshold voltage such that a subthreshold leakage current from the first transmission gate transistor maintains the second conduction terminal of the first transistor at a voltage representative of a logic level when the first transistor is turned off, the second transmission gate transistor having a threshold voltage such that a subthreshold leakage current from the second transmission gate transistor maintains the second conduction terminal of the second transistor at a voltage representative of the logic level when the second transistor is turned off, the first and second transistors comprising first and second pull-up transistors, and the random access memory cell being free of cross-coupled pull-down transistors.

2. The random access memory cell of claim 1, wherein:
    the first and second transmission gate transistors comprise thin film transistors.

3. The random access memory cell of claim 2, wherein:
    the first transmission gate transistor includes a gate region associated with the control terminal of the first transmission gate transistor and disposed within a monocrystalline semiconductor substrate, and source/drain regions formed in a first polycrystalline semiconductor layer above the monocrystalline semiconductor substrate and associated with the first and second conduction terminals of the first transmission gate transistor;
    the second transmission gate transistor includes a gate region associated with the control terminal of the second transmission gate transistor and disposed within the monocrystalline semiconductor substrate, and source/drain regions formed in the first polycrystalline semiconductor layer above the monocrystalline semiconductor substrate and associated with the first and second conduction terminals of the second transmission gate transistor.

4. The random access memory cell of claim 2, wherein:
    the first transmission gate transistor includes a gate region associated with the control terminal of the first transmission gate transistor in a gate polycrystalline semiconductor layer above the monocrystalline semiconductor substrate, and source/drain regions formed in a source-drain polycrystalline semiconductor layer above the monocrystalline semiconductor substrate and associated with the first and second conduction terminals of the first transmission gate transistor;
    the second transmission gate transistor includes a gate region associated with the control terminal of the second transmission gate transistor in the gate polycrystalline semiconductor layer, and source/drain regions formed in the source-drain polycrystalline semiconductor layer above the monocrystalline semiconductor substrate and associated with the first and second conduction terminals of the second transmission gate transistor.

5. The random access memory cell of claim 4, wherein:
    the gate polycrystalline semiconductor layer is disposed between the monocrystalline semiconductor substrate and the source-drain polycrystalline semiconductor layer.

6. The random access memory cell of claim 4, wherein:
    the source-drain polycrystalline semiconductor layer is disposed between the monocrystalline semiconductor substrate and the gate polycrystalline semiconductor layer.

7. The random access memory cell of claim 1, wherein:
    the first and second transistors comprise p-channel MOS transistors; and
    the first and second transmission gate transistors comprise n-channel MOS transistors.

8. A semiconductor memory device, comprising:
    an array of memory cells organized into a plurality of rows and columns of memory cells, wherein each row of memory cells is connected to a distinct word line and each column of memory cells is connected to a distinct pair of bit lines;
    address decode circuitry, coupled to the word lines and the bit lines, for receiving an input address and connecting a row of memory cells to the bit lines in response;
    data input-output circuitry, coupled to the bit lines, for providing input data to be written to the array of memory cells and providing output data read from the array of memory cells to circuitry external to the semiconductor memory device; and
    control circuitry which charges the bit lines to a low reference voltage level between memory access operations;

wherein each memory cell comprises:
  a first transistor having a control terminal, a first conduction terminal connected to a reference voltage supply and a second conduction terminal;
  a second transistor having a control terminal connected to the second conduction terminal of the first transistor, a first conduction terminal connected to the reference voltage supply and a second conduction terminal connected to the control terminal of the first transistor;
  a first transmission gate transistor having a control terminal connected to a word line, a first conduction terminal connected to a first bit line of a bit line pair, and a second conduction terminal connected to the second conduction terminal of the first transistor; and
  a second transmission gate transistor having a control terminal connected to the word line, a first conduction terminal connected to a second bit line of the bit line pair, and a second conduction terminal connected to the second conduction terminal of the second transistor;
  wherein the first transmission gate transistor has a subthreshold leakage current that maintains the second conduction terminal of the first transistor at a logic level when the first transistor is turned off, the second transmission gate transistor has a subthreshold leakage current that maintains the second conduction terminal of the second transistor at a logic level when the second transistor is turned off, the first and second transistors comprise a first and a second pull-up transistor, respectively, and each memory cell is free of cross-coupled pull-down transistors coupled to the first and second pull-up transistors.

9. The semiconductor memory device of claim 8, wherein:
  the first and second transmission gate transistors comprise thin film transistors.

10. The semiconductor memory device of claim 7, wherein:
  the first transmission gate transistor includes a gate region associated with the control terminal of the first transmission gate transistor and disposed within a monocrystalline semiconductor substrate, and source/drain regions formed in a first polycrystalline semiconductor layer above the monocrystalline semiconductor substrate and associated with the first and second conduction terminals of the first transmission gate transistor;
  the second transmission gate transistor includes a gate region associated with the control terminal of the second transmission gate transistor and disposed within the monocrystalline semiconductor substrate, and source/drain regions formed in the first polycrystalline semiconductor layer above the monocrystalline semiconductor substrate and associated with the first and second conduction terminals of the second transmission gate transistor.

11. The semiconductor memory device of claim 9, wherein:
  the first transmission gate transistor includes a gate region associated with the control terminal of the first transmission gate transistor in a gate polycrystalline semiconductor layer above the monocrystalline semiconductor substrate, and source/drain regions formed in a source-drain polycrystalline semiconductor layer above the monocrystalline semiconductor substrate and associated with the first and second conduction terminals of the first transmission gate transistor;
  the second transmission gate transistor includes a gate region associated with the control terminal of the second transmission gate transistor in the gate polycrystalline semiconductor layer, and source/drain regions formed in the source-drain polycrystalline semiconductor layer above the monocrystalline semiconductor substrate and associated with the first and second conduction terminals of the second transmission gate transistor.

12. The semiconductor memory device of claim 11, wherein:
  the gate polycrystalline semiconductor layer is disposed between the monocrystalline semiconductor substrate and the source-drain polycrystalline semiconductor layer.

13. The semiconductor memory device of claim 11, wherein:
  the source-drain polycrystalline semiconductor layer is disposed between the monocrystalline semiconductor substrate and the gate polycrystalline semiconductor layer.

14. The semiconductor memory device of claim 8, wherein:
  the first and second transistors comprise p-channel MOS transistors; and
  the first and second transmission gate transistors comprise n-channel MOS transistors.

15. A volatile memory cell, consisting essentially of:
  a first transistor having a control terminal, a first conduction terminal coupled to a reference voltage source and a second conduction terminal;
  a second transistor having a control terminal connected to the second conduction terminal of the first transistor, a first conduction terminal coupled to the reference voltage source and a second conduction terminal connected to the control terminal of the first transistor;
  a first transmission gate transistor having a control terminal, a first conduction terminal capable of being coupled to a first bit line of a bit line pair and a second conduction terminal connected to the second conduction terminal of the first transistor; and
  a second transmission gate transistor having a control terminal, a first conduction terminal capable of being coupled to a second bit line of the bit line pair, a second conduction terminal connected to the second conduction terminal of the second transistor, the first transistor and the second transistor comprise a first pull-up transistor and a second pull-up transistor, respectively, the reference voltage source comprises a high reference voltage source, and the volatile memory cell is free of cross-coupled pull-down transistors coupled to the first and second pull-up transistors.

16. The volatile memory cell of claim 15, wherein:
  the first transmission gate transistor has a subthreshold leakage current that maintains the second conduction terminal of the first transistor at a voltage level representative of a logic level that is the logical complement of the logic level represented by the reference voltage source, when the first transistor is turned off; and
  the second transmission gate transistor has a subthreshold leakage current that maintains the second conduction terminal of the second transistor at a voltage level representative of a logic level that is the logical complement of the logic level represented by the reference voltage source, when the second transistor is turned off.

17. The volatile memory cell of claim 15, wherein:
the first and second transmission gate transistors comprise thin film transistors.

18. The volatile memory cell of claim 17, wherein:
the first transmission gate transistor includes a gate region associated with the control terminal of the first transmission gate transistor and disposed within a monocrystalline semiconductor substrate, and source/drain regions formed in a first polycrystalline semiconductor layer above the monocrystalline semiconductor substrate and associated with the first and second conduction terminals of the first transmission gate transistor;
the second transmission gate transistor includes a gate region associated with the control terminal of the second transmission gate transistor and disposed within the monocrystalline semiconductor substrate, and source/drain regions formed in the first polycrystalline semiconductor layer above the monocrystalline semiconductor substrate and associated with the first and second conduction terminals of the second transmission gate transistor.

19. The volatile memory cell of claim 17, wherein:
the first transmission gate transistor includes a gate region associated with the control terminal of the first transmission gate transistor in a gate polysilicon layer above the monocrystalline semiconductor substrate, and source/drain regions formed in a source-drain polycrystalline semiconductor layer above the monocrystalline semiconductor substrate and associated with the first and second conduction terminals of the first transmission gate transistor; and
the second transmission gate transistor includes a gate region associated with the control terminal of the second transmission gate transistor in the gate polysilicon layer, and source/drain regions formed in the source-drain polycrystalline semiconductor layer above the monocrystalline semiconductor substrate and associated with the first and second conduction terminals of the second transmission gate transistor.

20. The volatile memory cell of claim 19, wherein:
the gate polycrystalline semiconductor layer is disposed between the monocrystalline semiconductor substrate and the source/drain polycrystalline semiconductor layer.

21. The volatile memory cell of claim 19, wherein:
the source/drain polycrystalline semiconductor layer is disposed between the monocrystalline semiconductor substrate and the gate polycrystalline semiconductor layer.

22. The volatile memory cell of claim 17, wherein:
the first and second transmission gate transistors comprise n-channel MOS transistors.

23. A semiconductor memory device, comprising:
an array of memory cells organized into a plurality of rows and columns of memory cells, wherein each row of memory cells is connected to a distinct word line and each column of memory cells is connected to a distinct pair of bit lines;
address decode circuitry, coupled to the word lines and the bit lines, for receiving an input address and connecting a row of memory cells to the bit lines in response;
data input-output circuitry, coupled to the bit lines, for providing input data to be written to the array of memory cells and providing output data read from the array of memory cells to circuitry external to the semiconductor memory device; and
control circuitry which charges the bit lines to a low reference voltage level between memory access operations;
wherein at least one memory cell comprises:
a first transistor having a control terminal, a first conduction terminal connected to a reference voltage supply and a second conduction terminal;
a second transistor having a control terminal connected to the second conduction terminal of the first transistor, a first conduction terminal connected to the reference voltage supply and a second conduction terminal connected to the control terminal of the first transistor;
a first transmission gate transistor having a control terminal connected to a word line, a first conduction terminal connected to a first bit line of a bit line pair, and a second conduction terminal connected to the second conduction terminal of the first transistor; and
a second transmission gate transistor having a control terminal connected to the word line, a first conduction terminal connected to a second bit line of the bit line pair, and a second conduction terminal connected to the second conduction terminal of the second transistor;
wherein the first transmission gate transistor has a subthreshold leakage current that maintains the second conduction terminal of the first transistor at a logic level when the first transistor is turned off, the second transmission gate transistor has a subthreshold leakage current that maintains the second conduction terminal of the second transistor at a logic level when the second transistor is turned off, the first and second transistors comprise a first and a second pull-up transistor, respectively, and the at least one memory cell is free of cross-coupled pull-down transistors coupled to the first and second pull-up transistors.

24. The semiconductor memory device of claim 23, wherein:
the first and second transmission gate transistors comprise thin film transistors.

25. The semiconductor memory device of claim 24, wherein:
the first transmission gate transistor includes a gate region associated with the control terminal of the first transmission gate transistor in a gate polycrystalline semiconductor layer above the monocrystalline semiconductor substrate, and source/drain regions formed in a source-drain polycrystalline semiconductor layer above the monocrystalline semiconductor substrate and associated with the first and second conduction terminals of the first transmission gate transistor;
the second transmission gate transistor includes a gate region associated with the control terminal of the second transmission gate transistor in the gate polycrystalline semiconductor layer, and source/drain regions formed in the source-drain polycrystalline semiconductor layer above the monocrystalline semiconductor substrate and associated with the first and second conduction terminals of the second transmission gate transistor.

26. The semiconductor memory device of claim 25, wherein:
the gate polycrystalline semiconductor layer is disposed between the monocrystalline semiconductor substrate and the source-drain polycrystalline semiconductor layer.

27. The semiconductor memory device of claim 25, wherein:

the source-drain polycrystalline semiconductor layer is disposed between the monocrystalline semiconductor substrate and the gate polycrystalline semiconductor layer.

28. The semiconductor memory device of claim 23, wherein:

the first transmission gate transistor includes a gate region associated with the control terminal of the first transmission gate transistor and disposed within a monocrystalline semiconductor substrate, and source/drain regions formed in a first polycrystalline semiconductor layer above the monocrystalline semiconductor substrate and associated with the first and second conduction terminals of the first transmission gate transistor;

the second transmission gate transistor includes a gate region associated with the control terminal of the second transmission gate transistor and disposed within the monocrystalline semiconductor substrate, and source/drain regions formed in the first polycrystalline semiconductor layer above the monocrystalline semiconductor substrate and associated with the first and second conduction terminals of the second transmission gate transistor.

29. The semiconductor memory device of claim 23, wherein:

the first and second transistors comprise p-channel MOS transistors; and the first and second transmission gate transistors comprise n-channel MOS transistors.

* * * * *